(12) United States Patent
Chang

(10) Patent No.: US 9,055,692 B2
(45) Date of Patent: Jun. 9, 2015

(54) SERVER AND PARTITION THEREOF

(71) Applicant: Wistron Corporation, New Taipei (TW)

(72) Inventor: Chia-Ming Chang, New Taipei (TW)

(73) Assignee: Wistron Corporation, New Taipei (TW)

( * ) Notice: Subject to any disclaimer, the term of this patent is extended or adjusted under 35 U.S.C. 154(b) by 327 days.

(21) Appl. No.: 13/787,835

(22) Filed: Mar. 7, 2013

(65) Prior Publication Data

US 2014/0204531 A1    Jul. 24, 2014

(30) Foreign Application Priority Data

Jan. 22, 2013    (TW) .............................. 102102388 A

(51) Int. Cl.
*H05K 5/00*    (2006.01)
*A47B 96/06*    (2006.01)
*E04G 3/00*    (2006.01)
*H05K 7/14*    (2006.01)

(52) U.S. Cl.
CPC .................................... *H05K 7/1489* (2013.01)

(58) Field of Classification Search
USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8; 292/1–62, 113, 292/169.11–169.23, 341.11–341.19
See application file for complete search history.

(56) References Cited

U.S. PATENT DOCUMENTS

| | | | |
|---|---|---|---|
| 6,456,498 B1 * | 9/2002 | Larson et al. .................. | 361/752 |
| 6,580,604 B1 * | 6/2003 | McAnally et al. .......... | 361/679.4 |
| 6,628,513 B1 * | 9/2003 | Gallagher et al. ........ | 361/679.33 |
| 2005/0243533 A1 | 11/2005 | Malone et al. | |
| 2008/0310123 A1 * | 12/2008 | Sherrod et al. ................. | 361/725 |
| 2011/0053485 A1 | 3/2011 | Huang et al. | |

FOREIGN PATENT DOCUMENTS

CN    2519983    11/2002

OTHER PUBLICATIONS

"Office Action of Taiwan Counterpart Application", issued on Dec. 17, 2014, with English translation thereof, p. 1-p. 21, in which the listed references were cited.

* cited by examiner

*Primary Examiner* — Jerry Wu
(74) *Attorney, Agent, or Firm* — Jianq Chyun IP Office

(57) ABSTRACT

A server includes a chassis, at least a partition and at least a server unit. The chassis has an accommodating cavity and a first fixing structure. The partition has a second fixing structure and includes a plate, a pivot component and a locking component. A first space and a second space are defined in the accommodating cavity by the plate. The locking component has at least a first locking portion and a stopping portion. The pivot component is pivoted between the plate and the locking component. When the locking component moves from a first position to a second position, the first locking portion is locked to the chassis and the locking component is positioned by a structural interference between the stopping portion and the chassis. The server unit is fixed in the first space by the first fixing structure or fixed in the second space by the second fixing structure.

23 Claims, 10 Drawing Sheets

SERVER AND PARTITION THEREOF

CROSS-REFERENCE TO RELATED APPLICATION

This application claims the priority benefit of Taiwan application serial no. 102102388, filed on Jan. 22, 2013. The entirety of the above-mentioned patent application is hereby incorporated by reference herein and made a part of this specification.

FIELD OF THE INVENTION

The invention relates to an electronic equipment and a partition thereof, and more particularly, to a server and a partition thereof.

DESCRIPTION OF RELATED ART

A so-called blade server is a server integrating hardware of a server system such as processor, memory, and even hard drive into a single motherboard as server units. The blade server also allows several server units to share a chassis, a power supply or other resources with each other, thereby lowering spatial requirements of the server. Since the blade server has the above advantage of saving arrangement space, manufacturers have been attracted to invest in development of such products.

In detail, generally, a fixing structure (e.g. sliding rail) is provided in the chassis of the blade server. The fixing structure is configured to fix both a full-height server unit of a bigger size and a half-height server unit of a smaller size. However, numbers of the fixing structures in many blade servers are designed correspondingly to the full-height server unit. Thus, even if the half-height server units are disposed in the chassis to leave arrangement space remaining, it is still difficult to utilize this remaining arrangement space for disposing more half-height server units. Based on the above, how to effectively utilize the space in the chassis for arranging a larger number of half-height server units is an important issue in structural design of the blade server.

SUMMARY OF THE INVENTION

The invention provides a server. A partition of the server is adapted to be mounted in a chassis and provide a fixing structure, which allows more server units to be arranged in the chassis.

The invention provides a partition. The partition is adapted to be mounted in a chassis and provide a fixing structure, which allows more server units to be arranged in the chassis.

The server of the invention includes a chassis, at least one partition and at least one server unit. The chassis has an accommodating cavity and a first fixing structure. The partition has a second fixing structure and includes a plate, a pivot component and a locking component. The plate is mounted in the accommodating cavity to define a first space and a second space in the accommodating cavity. One end of the pivot component is pivoted to the plate. The locking component has at least one first locking portion and a stopping portion. The other end of the pivot component is pivoted to the locking component. When the locking component sustains a force to move from a first position to a second position relative to the plate, the first locking portion is locked to the chassis and the locking component is positioned at the second position by a structural interference between the stopping portion and the chassis. The server unit is adapted to be fixed in the first space by the first fixing structure or be fixed in the second space by the second fixing structure.

The partition of the invention is adapted to a server. The server includes a chassis and at least one server unit. The chassis has an accommodating cavity and a first fixing structure. The partition has a second fixing structure and includes a plate, a pivot component and a locking component. The plate is mounted in the accommodating cavity to define a first space and a second space in the accommodating cavity. One end of the pivot component is pivoted to the plate. The locking component has at least one first locking portion and a stopping portion. The other end of the pivot component is pivoted to the locking component. When the locking component sustains a force to move from a first position to a second position relative to the plate, the first locking portion is locked to the chassis and the locking component is positioned at the second position by a structural interference between the stopping portion and the chassis. The server unit is adapted to be fixed in the first space by the first fixing structure or be fixed in the second space by the second fixing structure.

In an embodiment of the invention, the locking component is disposed on one side of the plate, and another side of the plate has at least one second locking portion locked to the chassis.

In an embodiment of the invention, the second locking portion is adapted to be locked to the chassis along a first direction. When the locking component sustains a force to move from the first position to the second position relative to the plate, the first locking portion is locked to the chassis along a second direction opposite the first direction.

In an embodiment of the invention, the plate has at least one first sliding slot. The locking component has at least one first protruding post and is slidably disposed in the first sliding slot by the first protruding post.

In an embodiment of the invention, the partition is adapted to enter the accommodating cavity along a direction. An extending direction of the first sliding slot is inclined toward the direction.

In an embodiment of the invention, one end of the locking component has an elastic arm. The stopping portion is located on the elastic arm. When the locking component sustains a force to move from the first position to the second position relative to the plate, the stopping portion is adapted to form the structural interference with the chassis by elastic deformation of the elastic arm.

In an embodiment of the invention, the partition further includes a first elastic component connected between the plate and the pivot component. When the structural interference between the stopping portion and the chassis is eliminated, the locking component moves from the second position to the first position by an elastic force of the first elastic component to disengage the first locking portion from the chassis.

In an embodiment of the invention, the first fixing structure includes a first sliding rail and the second fixing structure includes a second sliding rail. The server unit is adapted to enter the first space by sliding along the first sliding rail or enter the second space by sliding along the second sliding rail.

In an embodiment of the invention, the second sliding rail includes a plurality of bumps. A part of the bumps are connected to the locking component and another part of the bumps are connected to the plate. The server unit has a sliding portion adapted to be limited between each of the bumps and the plate.

In an embodiment of the invention, the server unit has a stopping element. When the server unit is located in the first space, the server unit is prevented from moving away from the accommodating cavity by a structural interference between the stopping element and the chassis. When the server unit is located in the second space, the server unit is prevented from moving away from the accommodating cavity by a structural interference between the stopping element and the partition.

In an embodiment of the invention, the partition further includes a pushing component disposed on the plate. The server unit has a connecting mechanism connected to the stopping element. When the server unit moves into the accommodating cavity, the pushing component pushes the connecting mechanism to drive the stopping element to protrude from a side surface of the server unit.

In an embodiment of the invention, the plate has at least one second sliding slot. The pushing component has at least one second protruding post and is slidably disposed in the second sliding slot by the second protruding post.

In an embodiment of the invention, the partition further includes a second elastic component connected between the pivot component and the pushing component. When the server unit moves into the accommodating cavity, the pushing component pushes the connecting mechanism by an elastic force of the second elastic component.

Based on the above, the partition of the invention is adapted to be mounted in the accommodating cavity of the chassis and has the second fixing structure. Accordingly, the server unit may not only be fixed in the first space in the accommodating cavity by the first fixing structure of the chassis, but may also be fixed in the second space in the accommodating cavity by the second fixing structure of the partition. In this way, the arrangement space in the chassis is effectively utilized for arranging more server units. Also, variability and selectivity in number and position of the server units arranged in the chassis are enhanced. In addition, the locking component of the invention has the first locking portion and the stopping portion, and the partition has the pivot component pivoted between the plate and the locking component. Accordingly, when a user intends to assemble the partition, he/she may first place the partition in the accommodating cavity of the chassis, and then apply a force to the locking component to cause the locking component to move from the first position to the second position relative to the plate by rotation of the pivot component. At this moment, the first locking portion is locked to the chassis, and the structural interference is formed between the stopping portion and the chassis to position the locking component, thereby completing the assembly of the partition. When the user intends to detach the partition, he/she may eliminate the structural interference between the stopping portion and the chassis to reset the locking component from the second position to the first position. Accordingly, the first locking portion is disengaged from the chassis to allow the partition to be detached from the chassis. By using the above assembling and detaching methods, the user is able to assemble the partition in the chassis or detach it therefrom easily and manually. Thus convenience in use of the partition is enhanced.

To make the above features and advantages of the invention more comprehensible, embodiments accompanied with drawings are described in detail as follows.

DESCRIPTION OF THE EMBODIMENTS

Figure 1:
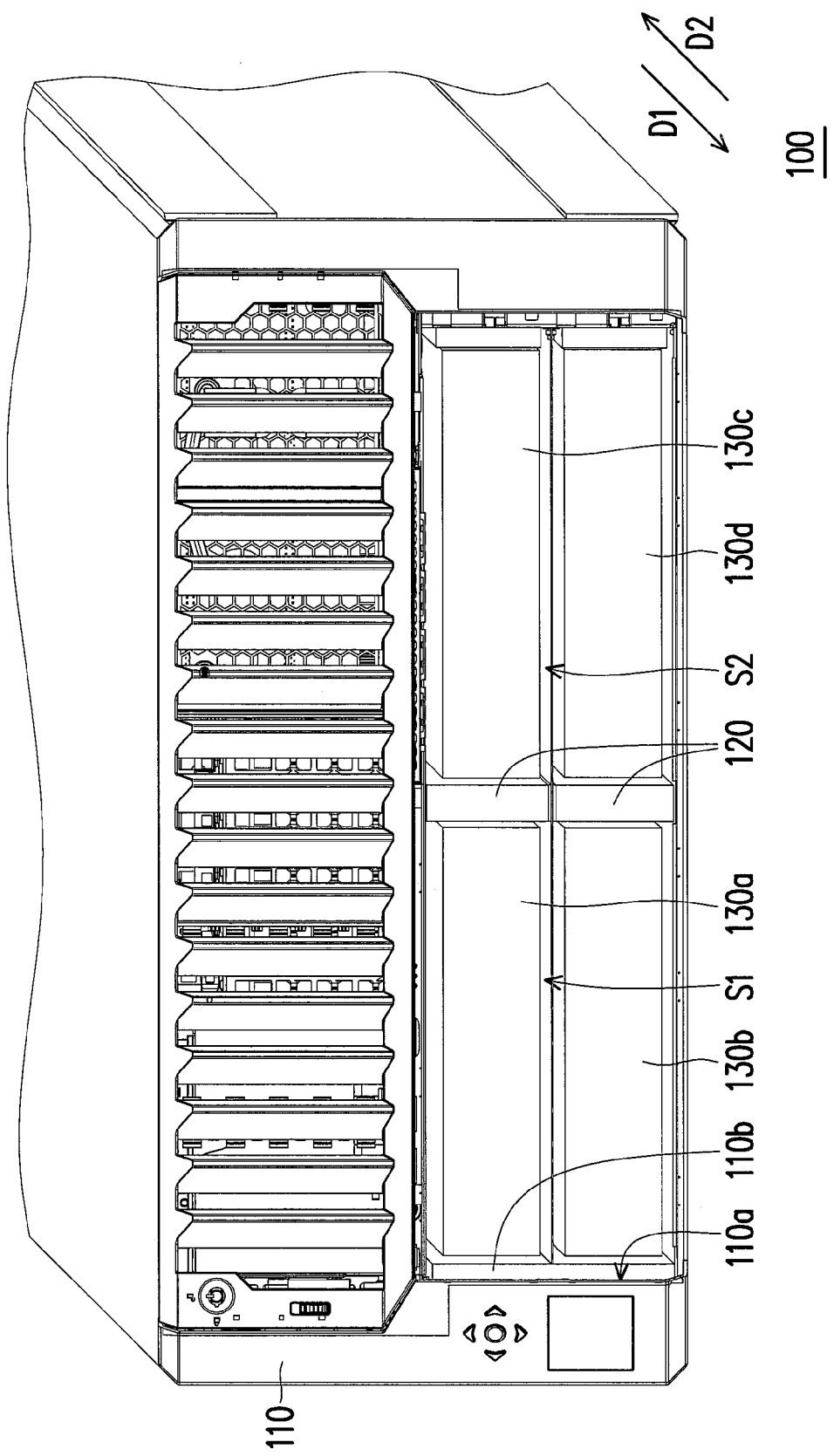
FIG. 1 is a partial three-dimensional view of a server according to an embodiment of the invention.

FIG. 1 is a partial three-dimensional view of a server according to an embodiment of the invention. Referring to FIG. 1, a server 100 of the present embodiment is, for example, a blade server, and includes a chassis 110, at least one partition 120 (two are illustrated), and at least one server unit (four are illustrated and labeled as 130a-130d). The chassis 110 has an accommodating cavity 110a. The partition 120 is configured to define a first space S1 and a second space S2 in the accommodating cavity 110a. The server units 130a-130d are arranged in the first space 51 or the second space S2 in the accommodating cavity 110a. It should be noted that the partition 120 is only schematically illustrated in FIG. 1 and a detailed structure thereof is not illustrated. The detailed structure of the partition 120 is described hereinafter with reference to FIG. 2 and FIG. 3.

Figure 2:
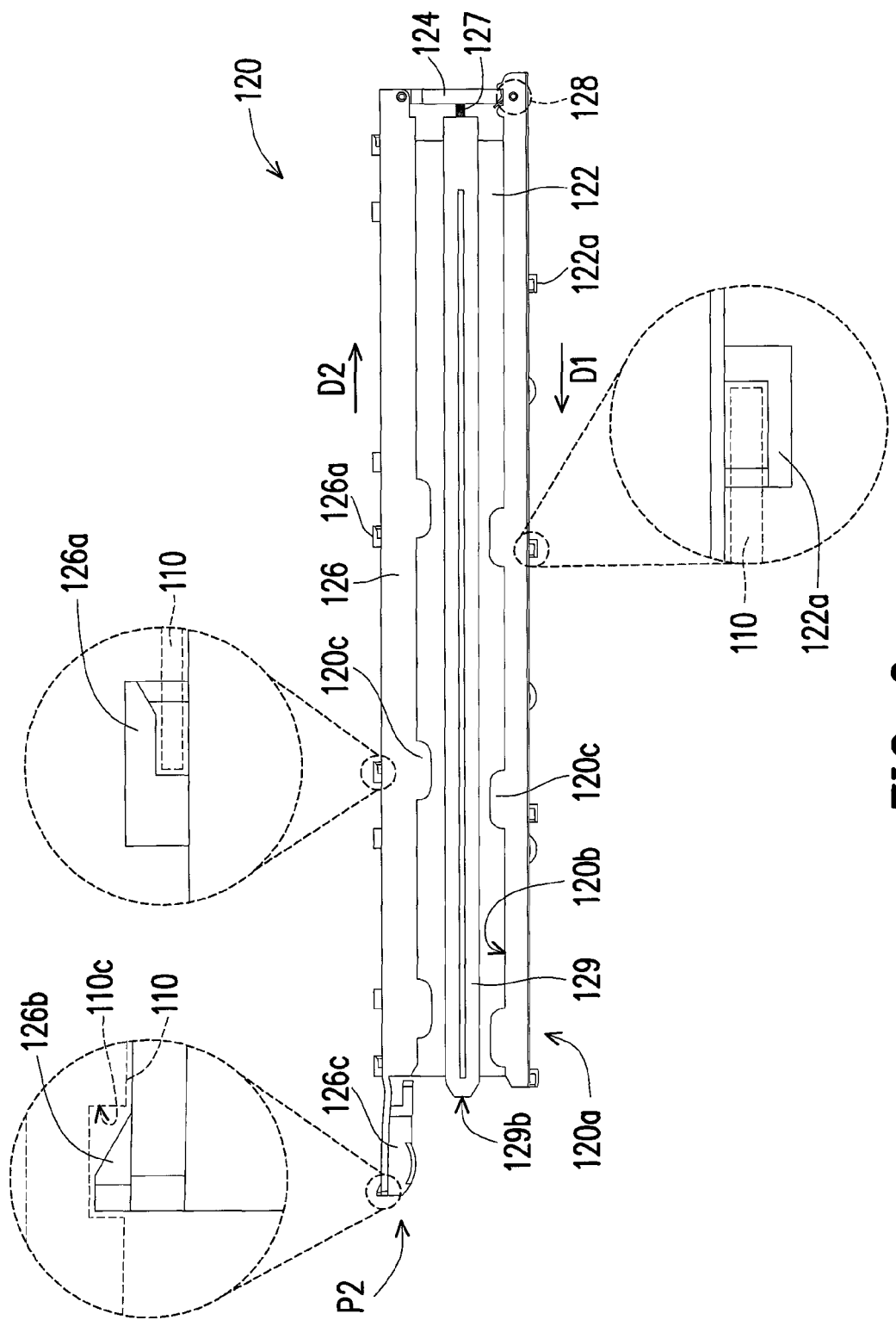
FIG. 2 is a side view of the partition in FIG. 1.
Figure 3:
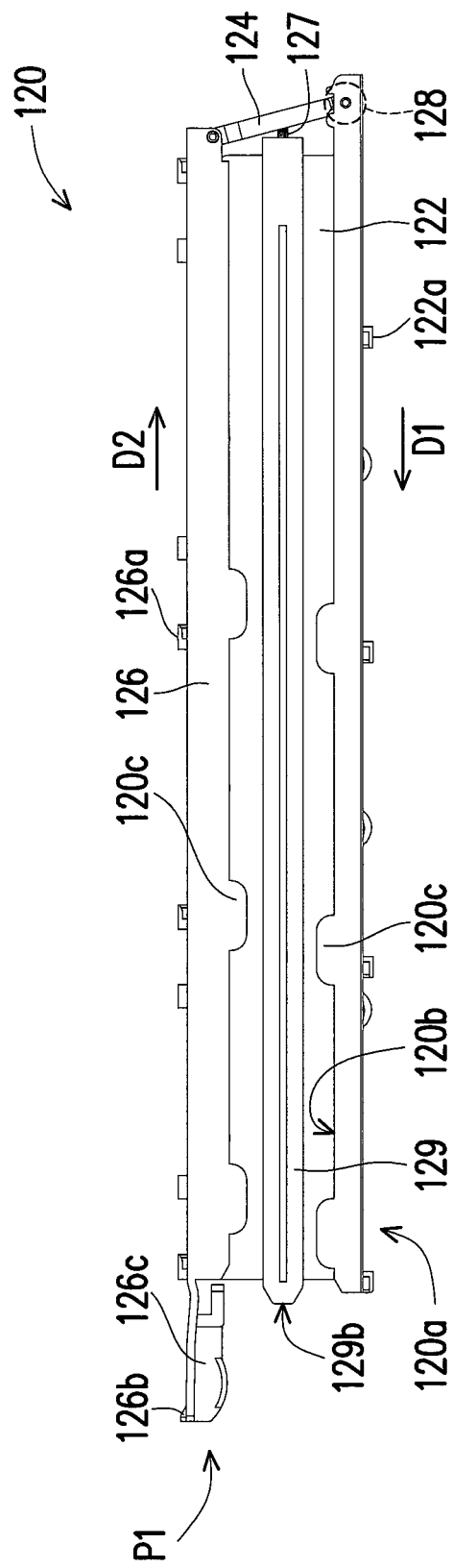
FIG. 3 illustrates the partition in FIG. 2 in a not yet assembled state.

FIG. 2 is a side view of the partition in FIG. 1. FIG. 3 illustrates the partition in FIG. 2 in a not yet assembled state. Referring to FIG. 1 to FIG. 3, the chassis 110 has a first fixing structure 110b, and the partition 120 has a second fixing structure 120a. The partition 120 includes a plate 122, a pivot component 124, a locking component 126 and a first elastic component 128. The plate 122 is mounted in the accommodating cavity 110a to define the first space S1 and the second space S2 in the accommodating cavity 110a. One end of the pivot component 124 (the upper end of the pivot component 124 illustrated in the drawing) is pivoted to the plate 122, and the other end of the pivot component 124 (the lower end of the pivot component 124 illustrated in the drawing) is pivoted to the locking component 126. The first elastic element 128 is a torsion spring, for example, connected between the pivot component 124 and the plate 122. The locking component 126 has at least one first locking portion 126a (a plurality is illustrated) and a stopping portion 126b.

The locking component 126 is adapted to sustain a force and resist an elastic force of the first elastic element 128 to move from a first position P1 as shown in FIG. 3 to a second position P2 as shown in FIG. 2 relative to the plate 122. At this moment, the first locking portion 126a is locked to the chassis 110 and the locking component 126 is positioned at the second position P2 by a structural interference between the stopping portion 126b and the chassis 110. In the present embodiment, the stopping portion 126b of the locking component 126 forms the structural interference with, for example, a recess 110c of the chassis 110.

The server, unit is adapted to be fixed in the first space S1 by the first fixing structure 110b of the chassis 110 or be fixed in the second space S2 by the second fixing structure 120a of the partition 120. Specifically, the server units 130a and 130b in FIG. 1 are fixed in the first space S1 by the first fixing structure 110b of the chassis 110, while the server units 130c and 130d are fixed in the second space S2 by the second fixing structure 120a of the partition 120.

With the above arrangement, the server unit may not only be fixed in the first space S1 in the accommodating cavity 110a by using the first fixing structure 110b of the chassis 110, but may also be fixed in the second space S2 in the accommodating cavity 110a by using the second fixing structure 120a of the partition 120. In this way, the arrangement space in the chassis 110 is effectively utilized for arranging more server units. Also, variability and selectivity in number and position of the server units arranged in the chassis 110 are enhanced. In addition, when a user intends to assemble the partition 120, he/she may first place the partition 120 in the accommodating cavity 110a of the chassis 110, and then apply a force to the locking component 126 to cause the locking component 126 to move from the first position P1 as shown in FIG. 3 upward to the second position P2 as shown in FIG. 2 relative to the plate 122 by rotation of the pivot component 124. At this moment, the first locking portion 126a is locked to the chassis 110 as described above, and a structural interference is formed between the stopping portion 126b and the chassis 110 to position the locking component 126, as described above, thereby completing the assembly of the partition 120. When the user intends to detach the partition 120, he/she may eliminate the structural interference between the stopping portion 126b and the chassis 110 to reset the locking component 126 from the second position P2 as shown in FIG. 2 to the first position P1 as shown in FIG. 3 by the elastic force of the first elastic component 128. Accordingly, the first locking portion 126b is disengaged from the chassis 110 to allow the partition 120 to be detached from the chassis 110. By using the above assembling and detaching methods, the user is able to assemble the partition 120 in the chassis 110 or detach it therefrom easily and manually. Thus convenience in use of the partition 120 is enhanced.

Figure 4:
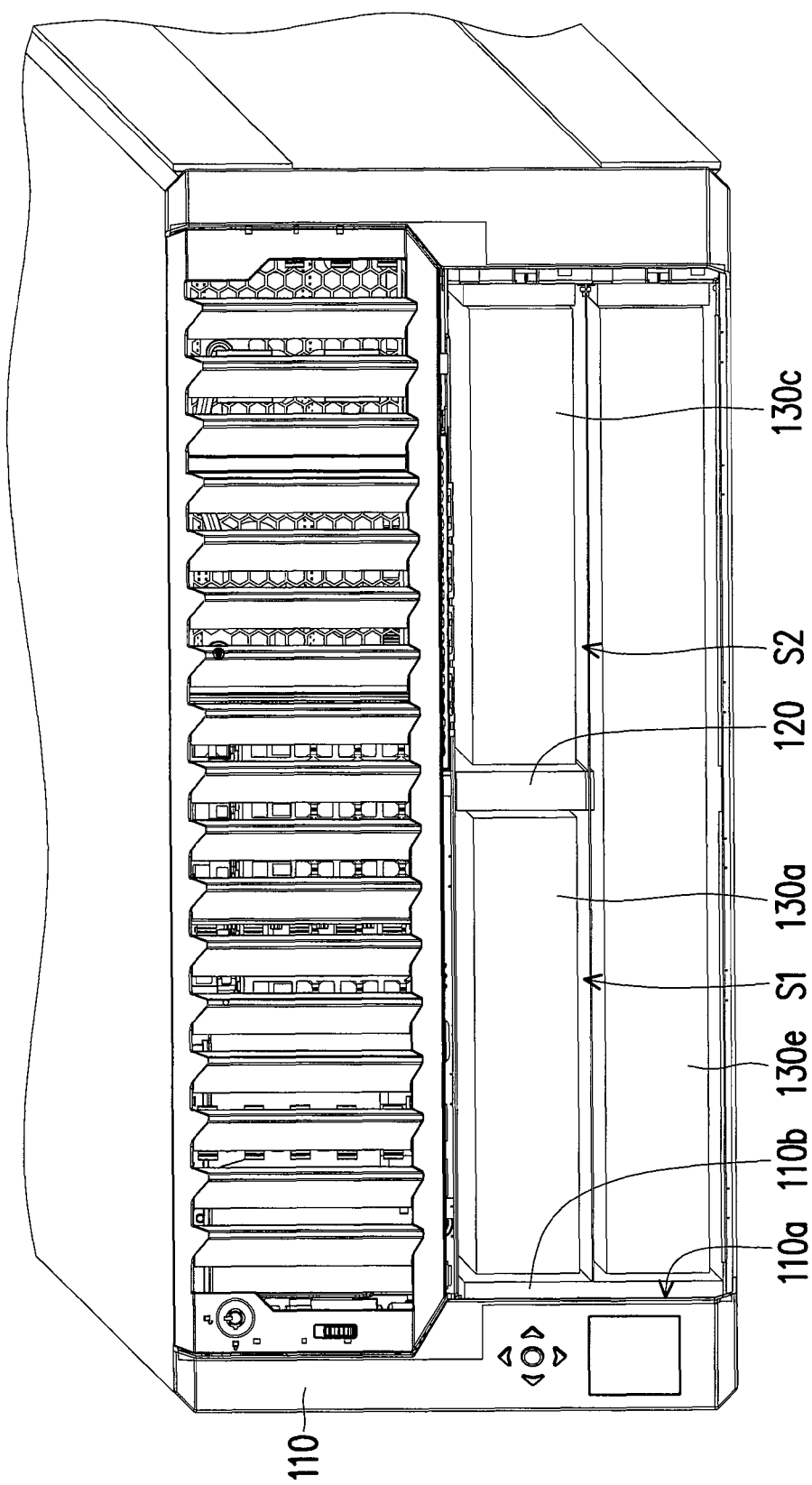
FIG. 4, FIG. 5 and FIG. 6 illustrate the chassis in FIG. 1 having different numbers of partitions and server units arranged therein.
Figure 5:
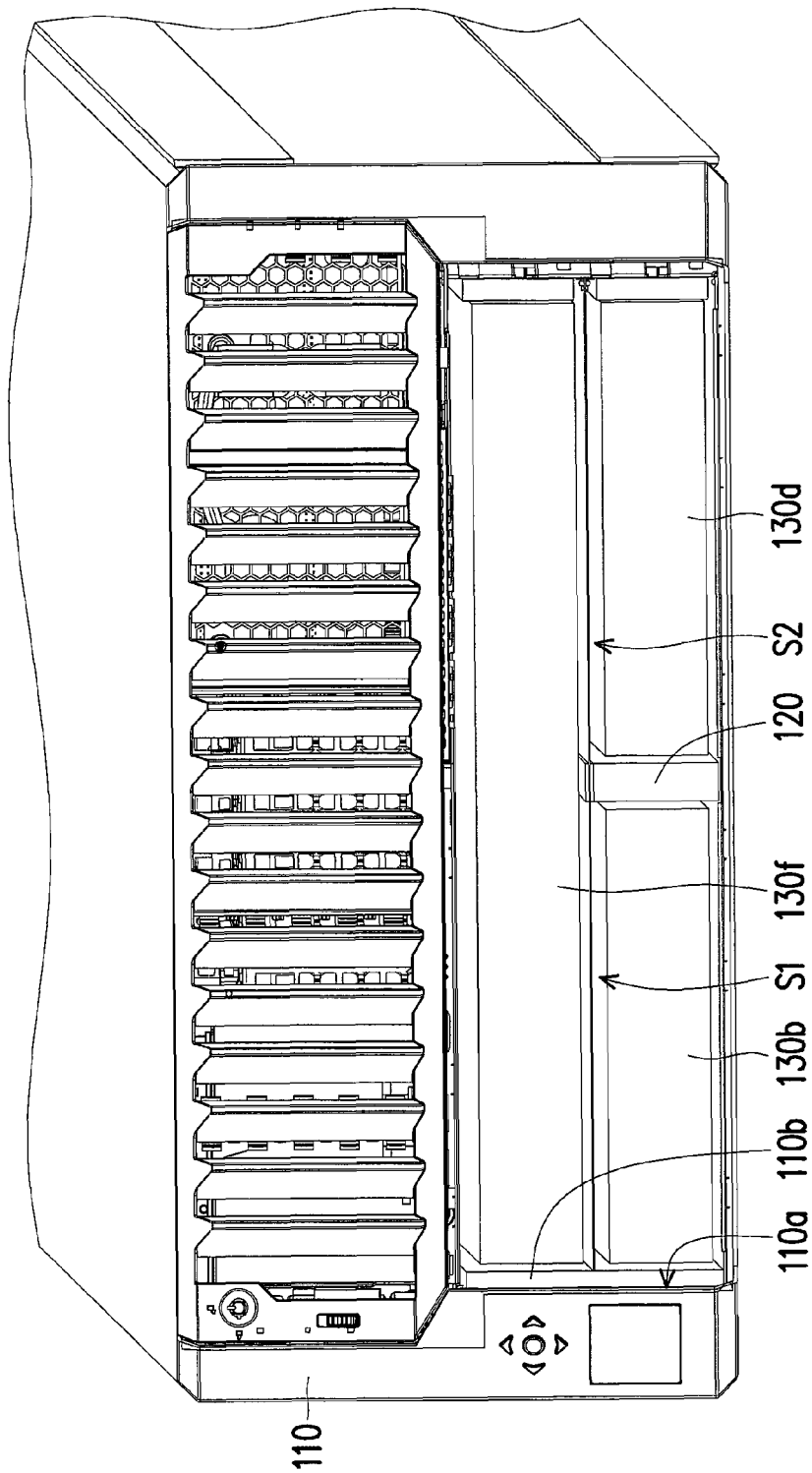
Figure 6:
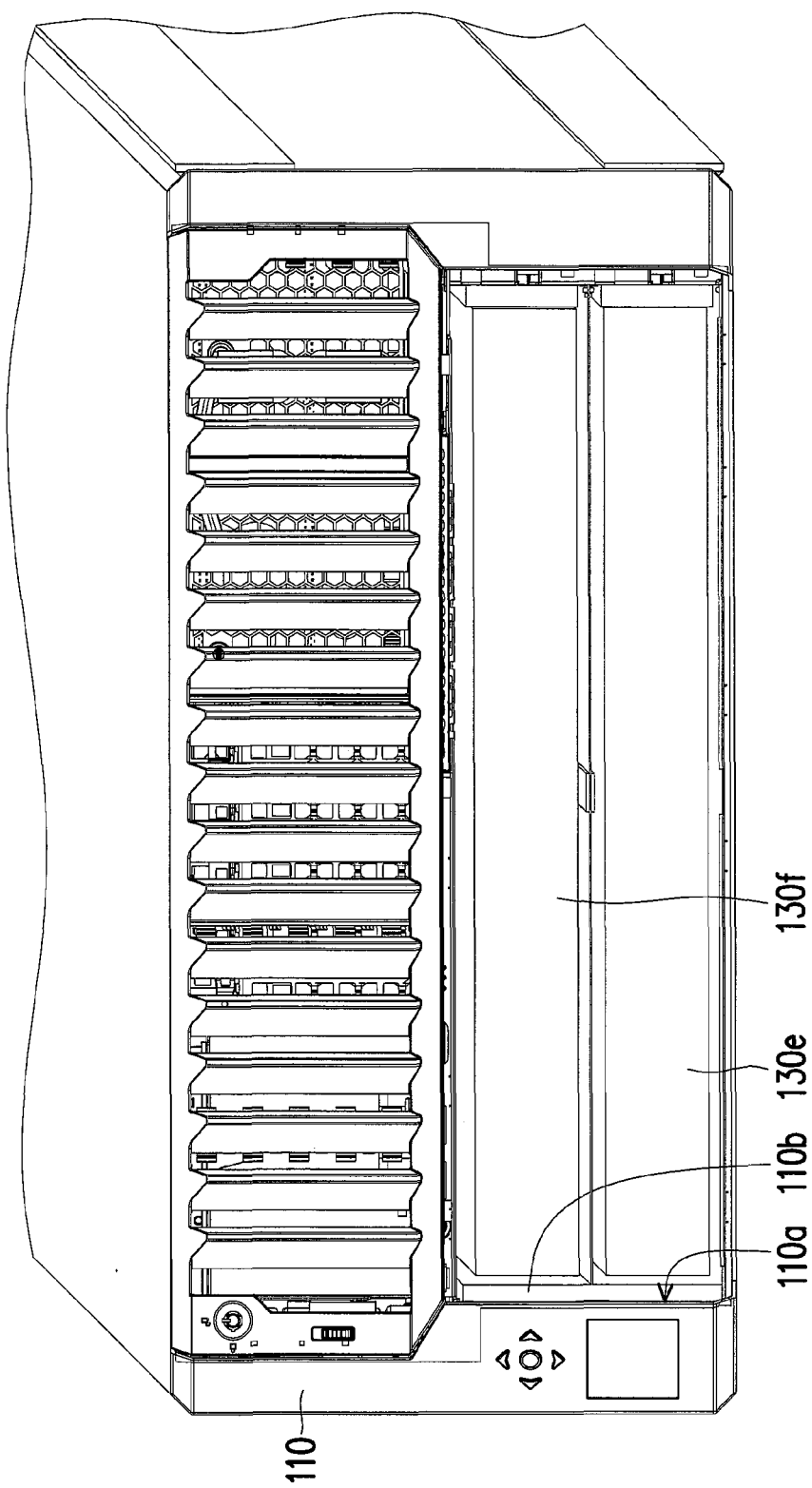

FIG. 4, FIG. 5 and FIG. 6 illustrate the chassis in FIG. 1 having different numbers of partitions and server units arranged therein. The user may arrange two partitions 120 in the accommodating cavity 110a, as shown in FIG. 1, for mounting four half-height server units (labeled as 130a-130d), or may arrange only one partition 120 in an upper layer in the accommodating cavity 110a, as shown in FIG. 4, for mounting two half-height server units (labeled as 130a and 130c) in the upper layer in the accommodating cavity 110a and one full-height server unit (labeled as 130e) in a lower layer in the accommodating cavity 110a. In addition, as shown in FIG. 5, only one partition 120 may be arranged in the lower layer in the accommodating cavity 110a for mounting two half-height server units (labeled as 130b and 130d) in the lower layer in the accommodating cavity 110a and one full-height server unit (labeled as 130f) in the upper layer in the accommodating cavity 110a, or, as shown in FIG. 6, there may be no partition arranged in the accommodating cavity 110a, for mounting two full-height server units (labeled as 130e and 130f) in the accommodating cavity 110a. As described above, by using the first fixing structure 110b existing in the chassis 110 in combination with the second fixing structure 120a of the partition 120, a plurality of server units are properly mounted in the chassis 110. Therefore, no matter the chassis 110 is placed in landscape orientation as shown in FIG. 1, FIG. 4, FIG. 5 and FIG. 6, or instead in portrait orientation, it is ensured that the server unit is stably mounted in the chassis 110. The invention does not limit the number of the partitions 120 mounted in the chassis 110, and more partitions 120 may be arranged in the chassis 110 as long as the space in the chassis 110 is sufficient, thus allowing more server units to be mounted in the chassis 110.

Referring to FIG. 2, the locking component 126 of the present embodiment is disposed on one side of the plate 122 (an upper side of the plate 122 illustrated in FIG. 2), and another side of the plate 122 (a lower side of the plate 122 illustrated in FIG. 2) has at least one second locking portion 122a. In the process of assembling the partition 120, first, the second locking portion 122a is locked to the chassis 110 along a first direction D1. Then, a force is applied to the locking component 126 to cause the locking component 126 to move from the first position P1 as shown in FIG. 3 to the second position P2 as shown in FIG. 2, so that the first locking portion 126a is locked to the chassis 110 along a second direction D2 opposite the first direction D1. By the opposite locking directions of the first locking portion 126a and the second locking portion 122a as described above, the partition 120 is stably assembled in the chassis 110.

In the present embodiment, one end of the locking component 126 has an elastic arm 126c, and the stopping portion 126b is located on the elastic arm 126c. When the locking component 126 sustains a force to move from the first position P1 as shown in FIG. 3 to the second position P2 as shown in FIG. 2, the stopping portion 126b is locked into the recess 110c of the chassis 110 by elastic deformation of the elastic arm 126c, thereby forming the structural interference between the stopping portion 126b and the chassis 110. In the process of detaching the partition 120, the user may eliminate the structural interference between the stopping portion 126b and the chassis 110 simply by applying a force on the elastic arm 126c to cause elastic deformation of the elastic arm 126c.

Figure 7:
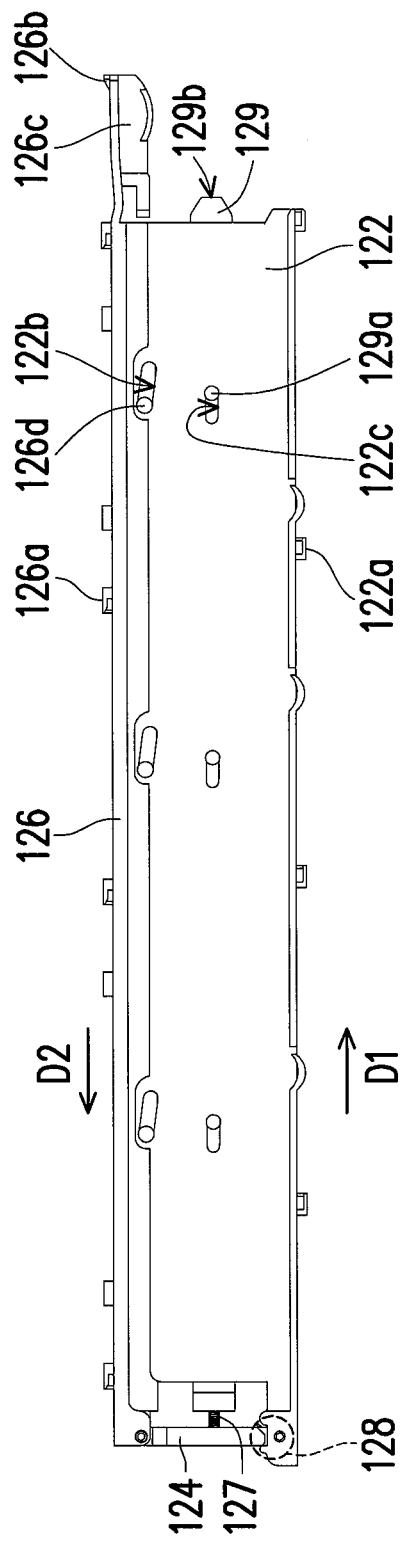
FIG. 7 is a side view of the partition in FIG. 2 from another view angle.

FIG. 7 is a side view of the partition in FIG. 2 from another view angle. Referring to FIG. 7, the plate 122 of the present embodiment has at least one first sliding slot 122b (three are illustrated). The locking component 126 has at least one first protruding post 126d (three are illustrated) and is slidably disposed in the first sliding slot 122b by the first protruding post 126d. In the present embodiment, in the process of assembling the partition 120, the partition 120 is adapted to enter the accommodating cavity 110a of the chassis 110 along the second direction D2, and an extending direction of the first sliding slot 122b is designed to be inclined toward the second direction D2. Accordingly, the locking component 126 is adapted to be moved from the first position P1 as shown in FIG. 3 upward to the second position P2 as shown in FIG. 2 along an inclining direction of the first sliding slot 122b, thereby smoothly locking the first locking portion 126a of the locking component 126 to the chassis 110.

Figure 8:
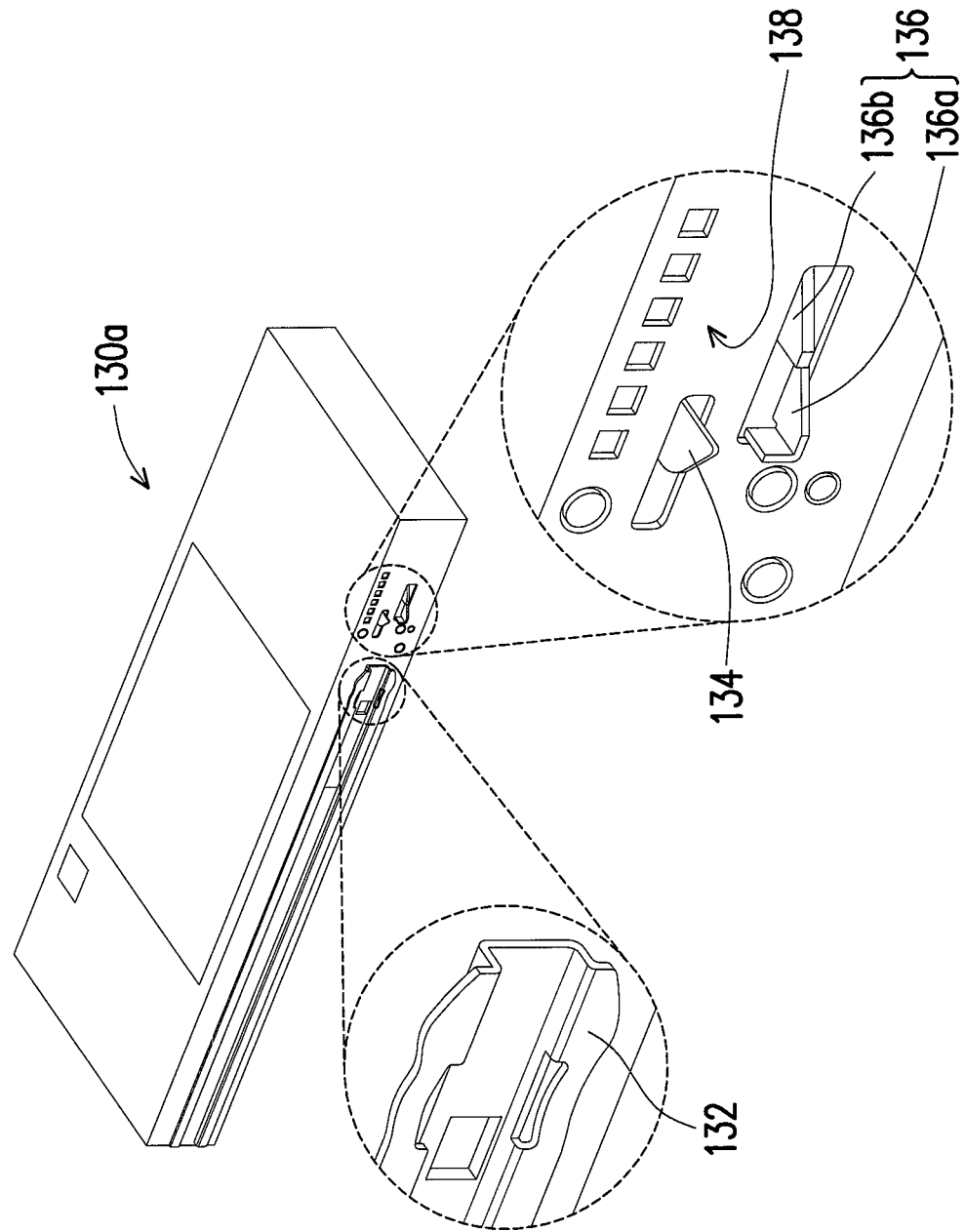
FIG. 8 is a three-dimensional view of the server unit in FIG. 1.
Figure 9:
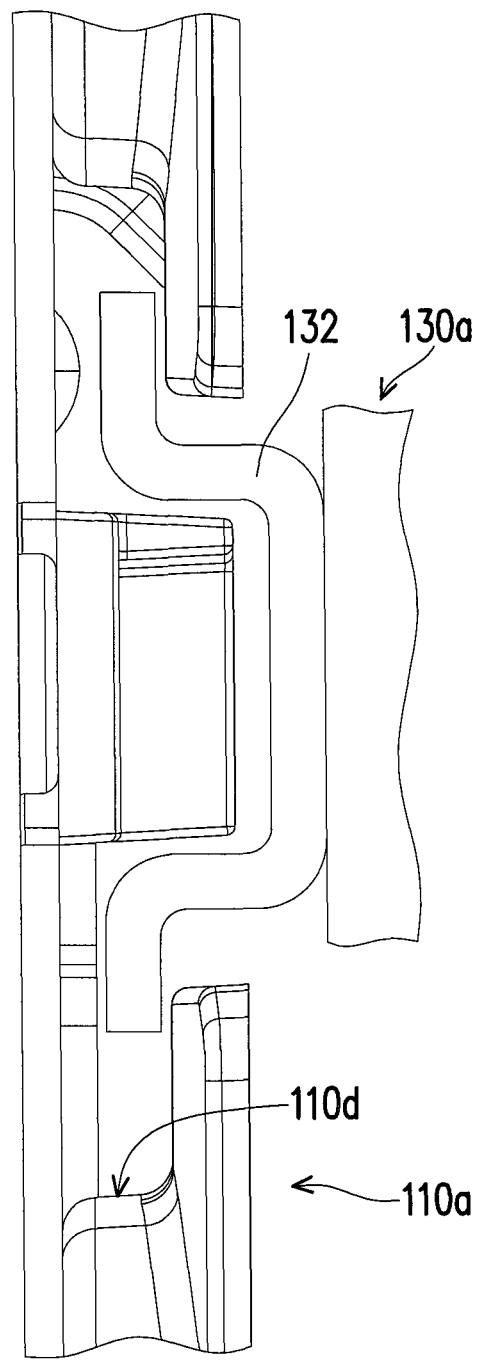
FIG. 9 is a partial front view of the first fixing structure and server unit in FIG. 1.
Figure 10:
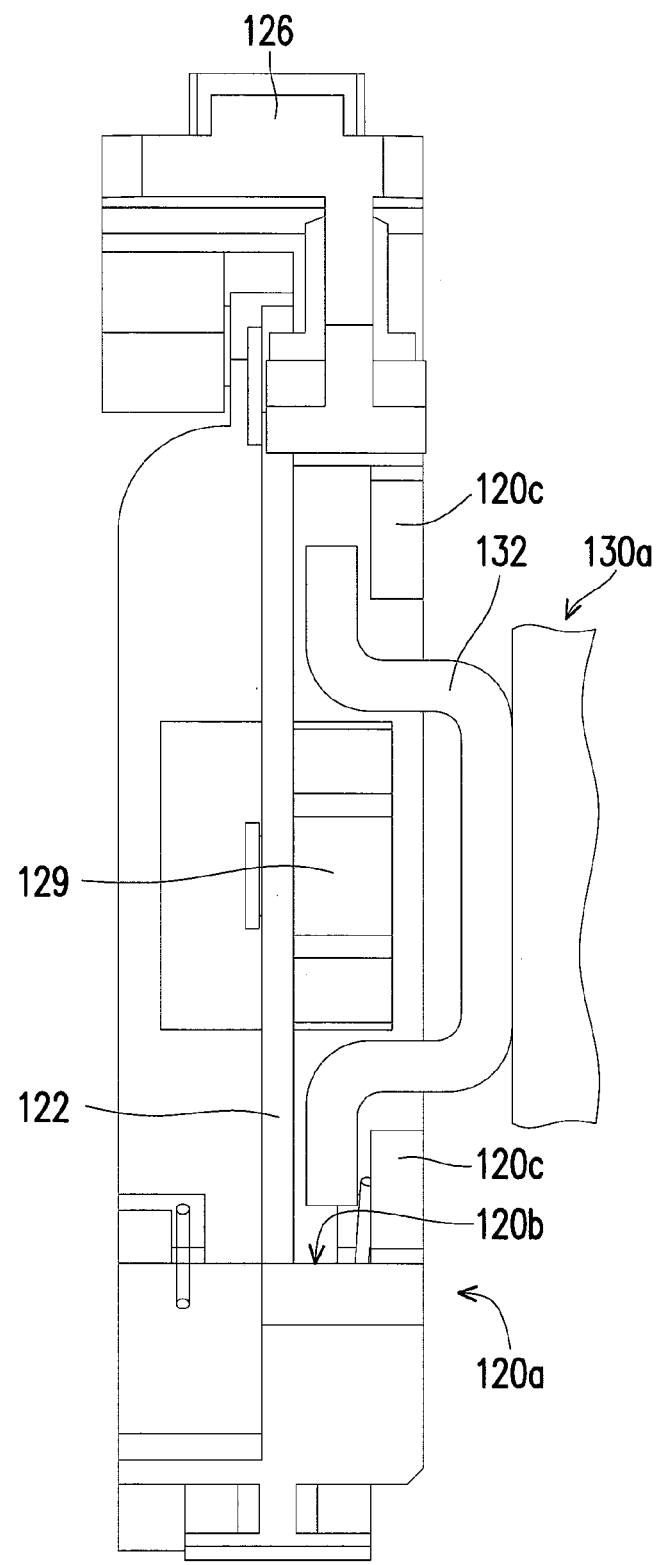
FIG. 10 is a partial front view of the second fixing structure and server unit in FIG. 1.

Manners of assembling the server unit to the first fixing structure 110b and the second fixing structure 120a are specifically described hereinafter with reference to the drawings. FIG. 8 is a three-dimensional view of the server unit in FIG. 1. FIG. 9 is a partial front view of the first fixing structure and server unit in FIG. 1. FIG. 10 is a partial front view of the second fixing structure and server unit in FIG. 1. In the present embodiment, the server unit 130a has a sliding portion 132, as shown in FIG. 8. The first fixing structure 110b includes a first sliding rail 110d, as shown in FIG. 9. The second fixing structure 120a includes a second sliding rail 120b, as shown in FIG. 10. The server unit 130a is adapted to enter the first space S1 as shown in FIG. 1 by sliding along the first sliding rail 110d of the first fixing structure 110b or enter the second space S2 as shown in FIG. 1 by sliding along the second sliding rail 120b of the second fixing structure 120a. Referring to FIG. 2 and FIG. 10, in further detail, the second sliding rail 120b includes a plurality of bumps 120c. A part of the bumps 120c are connected to the locking component 126 and another part of the bumps 120c are connected to the plate 122. The sliding portion 132 of the server unit 130a is adapted to be limited between each of the bumps 120c and the plate 122, as shown in FIG. 10. It should be noted that the above description has been provided by taking the server unit 130a in FIG. 1 as an example. The server units 130b-130f in FIG. 1, FIG. 4, FIG. 5 and FIG. 6, for example, all have the sliding portion 132 as shown in FIG. 8, and are capable of being assembled to the first sliding rail 110d of the first fixing structure 110b as shown in FIG. 9, or to the second sliding rail 120c of the second fixing structure 120a as shown in FIG. 10.

Referring to FIG. 8, the server unit 130a of the present embodiment has a stopping element 134. When the server unit 130a is located in the first space S1 as shown in FIG. 1, a structural interference is formed between the stopping element 134 and the chassis 110 to prevent the server unit 130a from moving away from the accommodating cavity 110a. When the server unit 130a is located in the second space S2 as shown in FIG. 1, a structural interference is formed between the stopping element 134 and the partition 120 to prevent the server unit 130a from moving away from the accommodating cavity 110a.

Operations of the stopping element 134 are described further below. Referring to FIG. 2 and FIG. 7, the plate 122 of the present embodiment has at least one second sliding slot 122c (three are illustrated in FIG. 7). The partition 120 further includes a second elastic component 127 and a pushing component 129. The pushing component 129 has at least one second protruding post 129a and is slidably disposed in the second sliding slot 122c of the plate 122 by the second protruding post 129a. The second elastic element 127 is a compression spring, for example, connected between the pivot component 124 and the pushing component 129. The server unit 130a has a connecting mechanism 136, as shown in FIG. 8. The connecting mechanism 136, for example, includes a first module 136a and a second module 136b, and is connected to the stopping element 134. When the server unit 130a moves into the accommodating cavity 110a as shown in FIG. 1, the pushing component 129 on the partition 120 pushes the first module 136a of the connecting mechanism 136 by its end 129b (illustrated in FIG. 2 and FIG. 7) by an elastic force of the second elastic component 127. At this moment, the second module 136b of the connecting mechanism 136 is pushed by the first module 136a to drive the stopping element 134 to protrude from a side surface 138 of the server unit 130a (the stopping element 134 is illustrated in FIG. 8 in the protruding state), so that the stopping element 134 is adapted to form the structural interference with the chassis 110 or the partition 120. It should be noted that the above description has been provided by taking the server unit 130a in FIG. 1 as an example. The server units 130b-130f in FIG. 1, FIG. 4, FIG. 5 and FIG. 6, for example, all have the stopping element 134 and the connecting mechanism 136 as shown in FIG. 8, and are capable of forming a structural interference with the chassis 110 or the partition 120 by the stopping element 134. In addition, the invention does not limit the form of the connecting mechanism 136. In other embodiments, the connecting mechanism 136 may be of other suitable forms and constitutions to be adapted to drive the operations of the stopping element 134.

In summary, the partition of the invention is mounted in the accommodating cavity of the chassis and has the second fixing structure. Accordingly, the server unit may not only be fixed in the first space in the accommodating cavity by the first fixing structure of the chassis, but may also be fixed in the second space in the accommodating cavity by the second fixing structure of the partition. In this way, the arrangement space in the chassis is effectively utilized for arranging more server units. Also, variability and selectivity in number and position of the server units arranged in the chassis are enhanced. In addition, the locking component of the invention has the first locking portion and the stopping portion, and the partition has the pivot component pivoted between the plate and the locking component. Accordingly, when the user intends to assemble the partition, he/she may first place the partition in the accommodating cavity of the chassis, and then apply a force to the locking component to cause the locking component to move from the first position to the second position relative to the plate by rotation of the pivot component. At this moment, the first locking portion is locked to the chassis, and the structural interference is formed between the stopping portion and the chassis to position the locking component, thereby completing the assembly of the partition. When the user intends to detach the partition, he/she may eliminate the structural interference between the stopping portion and the chassis to reset the locking component from the second position to the first position. Accordingly, the first locking portion is disengaged from the chassis to allow the partition to be detached from the chassis. By using the above assembling and detaching methods, the user is able to assemble the partition in the chassis or detach it therefrom easily and manually. Thus convenience in use of the partition is enhanced. In addition, in cases where there is sufficient space in the chassis, more partitions may be arranged in the chassis according to requirements, thus allowing more server units to be mounted in the chassis.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A server comprising: a chassis having an accommodating cavity and a first fixing structure; at least one partition having a second fixing structure and comprising: a plate mounted in the accommodating cavity to define a first space and a second space in the accommodating cavity; a pivot component, with one end pivoted to the plate; and a locking component having at least one first locking portion and a stopping portion located on an end portion of an elastic arm, wherein the other end of the pivot component is pivoted to the locking component, and when the locking component sustains a force to move from a first position to a second position relative to the plate by rotation of the pivot component, the at least one first locking portion is locked to the chassis and the locking component is positioned at the second position by a structural interference between the stopping portion and the chassis by elastic deformation of the elastic arm; and at least one server unit adapted to be fixed in the first space by the first fixing structure or be fixed in the second space by the second fixing structure.

2. The server as claimed in claim 1, wherein the locking component is disposed on one side of the plate, and another side of the plate has at least one second locking portion locked to the chassis.

3. The server as claimed in claim 2, wherein the second locking portion is adapted to be locked to the chassis along a first direction, and when the locking component sustains a force to move from the first position to the second position relative to the plate, the first locking portion is locked to the chassis along a second direction opposite the first direction.

4. The server as claimed in claim 1, wherein the plate has at least one first sliding slot, and the locking component has at least one first protruding post and is slidably disposed in the first sliding slot by the first protruding post.

5. The server as claimed in claim 4, wherein the partition is adapted to enter the accommodating cavity along a direction, and an extending direction of the first sliding slot is inclined toward the direction.

6. The server as claimed in claim 1, wherein the partition further comprises a first elastic component connected between the plate and the pivot component, and when the structural interference between the stopping portion and the chassis is eliminated, the locking component moves from the second position to the first position by an elastic force of the first elastic component to disengage the first locking portion from the chassis.

7. The server as claimed in claim 1, wherein the first fixing structure comprises a first sliding rail and the second fixing structure comprises a second sliding rail, and the server unit is adapted to enter the first space by sliding along the first sliding rail or enter the second space by sliding along the second sliding rail.

8. The server as claimed in claim 7, wherein the second sliding rail comprises a plurality of bumps, a part of the bumps are connected to the locking component and another part of the bumps are connected to the plate, and the server unit has a sliding portion adapted to be limited between each of the bumps and the plate.

9. The server as claimed in claim 1, wherein the server unit has a stopping element, the server unit is prevented from moving away from the accommodating cavity by a structural interference between the stopping element and the chassis when the server unit is located in the first space, and the server unit is prevented from moving away from the accommodating cavity by a structural interference between the stopping element and the partition when the server unit is located in the second space.

10. The server as claimed in claim 9, wherein the partition further comprises a pushing component disposed on the plate, the server unit has a connecting mechanism connected to the stopping element, and when the server unit moves into the accommodating cavity, the pushing component pushes the connecting mechanism to drive the stopping element to protrude from a side surface of the server unit.

11. The server as claimed in claim 10, wherein the plate has at least one second sliding slot, and the pushing component has at least one second protruding post and is slidably disposed in the second sliding slot by the second protruding post.

12. The server as claimed in claim 10, wherein the partition further comprises a second elastic component connected between the pivot component and the pushing component, and when the server unit moves into the accommodating cavity, the pushing component pushes the connecting mechanism by an elastic force of the second elastic component.

13. A partition adapted to a server, the server comprising a chassis and at least one server unit, the chassis having an accommodating cavity and a first fixing structure, the partition having a second fixing structure and comprising: a plate mounted in the accommodating cavity to define a first space and a second space in the accommodating cavity; a pivot component, with one end pivoted to the plate; and a locking component having at least one first locking portion and a stopping portion, wherein the other end of the pivot component is pivoted to the locking component on one side of the plate, at least one second locking portion locked on another side of the plate and locked to the chassis in a first direction; and when the locking component sustains a force to move from a first position to a second position relative to the plate, the first locking portion is locked to the chassis along a second direction opposite the first direction and the locking component is positioned at the second position by a structural interference between the stopping portion and the chassis, wherein the server unit is adapted to be fixed in the first space by the first fixing structure or be fixed in the second space by the second fixing structure.

14. The partition as claimed in claim 13, wherein the plate has at least one first sliding slot, and the locking component has at least one first protruding post and is slidably disposed in the first sliding slot by the first protruding post.

15. The partition as claimed in claim 14, wherein the partition is adapted to enter the accommodating cavity along a direction, and an extending direction of the first sliding slot is inclined toward the direction.

16. The partition as claimed in claim 13, wherein one end of the locking component has an elastic arm, the stopping portion is located on the elastic arm, and when the locking component sustains a force to move from the first position to the second position relative to the plate, the stopping portion is adapted to form the structural interference with the chassis by elastic deformation of the elastic arm.

17. The partition as claimed in claim 16, further comprising a first elastic component, wherein the first elastic component is connected between the plate and the pivot component, and when the structural interference between the stopping portion and the chassis is eliminated, the locking component moves from the second position to the first position by an elastic force of the first elastic component to disengage the first locking portion from the chassis.

18. The partition as claimed in claim 13, wherein the first fixing structure comprises a first sliding rail and the second fixing structure comprises a second sliding rail, and the server unit is adapted to enter the first space by sliding along the first sliding rail or enter the second space by sliding along the second sliding rail.

19. The partition as claimed in claim 18, wherein the second sliding rail comprises a plurality of bumps, a part of the bumps are connected to the locking component and another part of the bumps are connected to the plate, and the server unit has a sliding portion adapted to be limited between each of the bumps and the plate.

20. The partition as claimed in claim 13, wherein the server unit has a stopping element, the server is prevented from moving away from the accommodating cavity by a structural interference between the stopping element and the chassis when the server unit is located in the first space, and the server is prevented from moving away from the accommodating cavity by a structural interference between the stopping element and the partition when the server unit is located in the second space.

21. The partition as claimed in claim 20, further comprising a pushing component, wherein the pushing component is disposed on the plate, the server unit has a connecting mechanism connected to the stopping element, and when the server unit moves into the accommodating cavity, the pushing component pushes the connecting mechanism to drive the stopping element to protrude from a side surface of the server unit.

22. The partition as claimed in claim 21, wherein the plate has at least one second sliding slot, and the pushing component has at least one second protruding post and is slidably disposed in the second sliding slot by the second protruding post.

23. The partition as claimed in claim 21, further comprising a second elastic component connected between the pivot component and the pushing component, the pushing component pushing the connecting mechanism by an elastic force of the second elastic component when the server unit moves into the accommodating cavity.

* * * * *